(12) United States Patent
Parker et al.

(10) Patent No.: US 6,882,510 B2
(45) Date of Patent: Apr. 19, 2005

(54) LOW COST ANTI-PARALLEL PINNED SPIN VALVE (SV) AND MAGNETIC TUNNEL JUNCTION (MTJ) STRUCTURES WITH HIGH THERMAL STABILITY

(75) Inventors: Michael Andrew Parker, Fremont, CA (US); Robert Otto Schwenker, San Jose, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 225 days.

(21) Appl. No.: 10/254,345

(22) Filed: Sep. 24, 2002

(65) Prior Publication Data

US 2004/0057164 A1 Mar. 25, 2004

(51) Int. Cl.$^7$ ................................................. G11B 5/39
(52) U.S. Cl. .............................. 360/324.11; 360/324.12
(58) Field of Search ........................ 360/324.1, 324.11, 360/324.12, 324.2, 135

(56) References Cited

U.S. PATENT DOCUMENTS

| | | | |
|---|---|---|---|
| 5,465,185 A | 11/1995 | Heim et al. | ............. 360/324.11 |
| 5,841,692 A | 11/1998 | Gallagher et al. | ........... 365/173 |
| 6,111,729 A | 8/2000 | Kamiguchi et al. | ........ 360/324.1 |
| 6,120,919 A | 9/2000 | Shigematsu et al. | ......... 428/692 |
| 6,141,191 A | 10/2000 | Lee et al. | ................. 360/324.1 |
| 6,153,320 A | 11/2000 | Parkin | .......................... 428/693 |
| 6,197,439 B1 * | 3/2001 | Parkin et al. | ................ 428/678 |
| 6,689,497 B1 * | 2/2004 | Girt | ..................... 428/694 TM |

* cited by examiner

Primary Examiner—Jefferson Evans
(74) Attorney, Agent, or Firm—Robert O. Guillot; Intellectual Property Law Offices

(57) ABSTRACT

The invention is a laminated antiferromagnetically coupled (AFC) structure for use in a spin valve (SV) sensor or magnetic tunnel junction (MTJ) device, having two ferromagnetic films coupled together with an improved AFC film. Particularly the AFC film comprises an alloy material selected from the group consisting of $Ru_{100-x}m_x$, $Os_{100-y}m_y$, $Ir_{100-y}m_y$, $Rh_{100-y}m_y$, $Re_{100-z}m_z$, and $M_{100-x}m_x$, where M is an alloy of two or more materials selected from the group consisting of Ru, Os, Ir, Rh, and Re, and where m is a material selected from the group consisting of W, Ta, Mo, Nb and alloys of two or more materials selected from W, Ta, Mo, and Nb, and where x is between approximately 5 and 95 at. %, y is between approximately 10 and 90 at. %, and z is between approximately 25 and 75 at. %. The sensors may be used in magnetic heads of hard disk drives.

23 Claims, 3 Drawing Sheets

Figure 1:
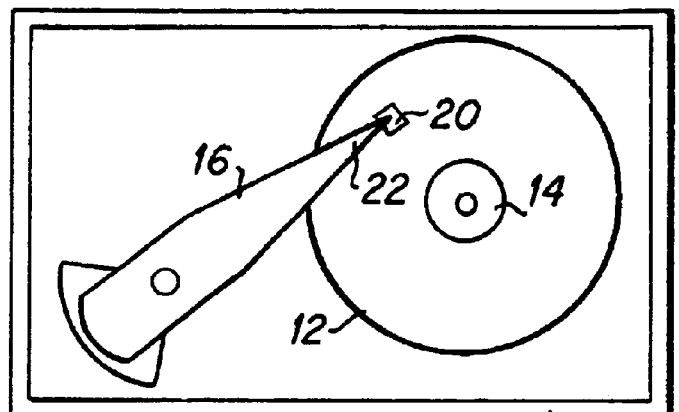

LOW COST ANTI-PARALLEL PINNED SPIN VALVE (SV) AND MAGNETIC TUNNEL JUNCTION (MTJ) STRUCTURES WITH HIGH THERMAL STABILITY

BACKGROUND OF THE INVENTION

1. Field of the Invention

The present invention relates generally to magnetic sensors, such as magnetoresistive spin valve (SV) sensor structures for magnetic heads of hard disk drives, and magnetic tunnel junction (MTJ) structures for use as memory cells and as magnetoresistive sensors for magnetic heads of hard disk drives, and more particularly to the use of low cost, high melting point alloy materials for antiferromagnetic coupling (AFC) films in laminated ferromagnetic layer structures of the SV and MTJ devices.

2. Description of the Prior Art

One type of a GMR read head is a sandwich structure comprising two uncoupled ferromagnetic layers separated by a nonmagnetic metallic electrically conducting spacer layer, typically copper (Cu), in which the magnetization direction (magnetic moment) of one of the ferromagnetic layers is fixed or pinned, while the magnetization direction of the free or sensing ferromagnetic layer is free to rotate. This type of GMR device is referred to as a spin valve (SV) magnetoresistive sensor in which only the free or sensing ferromagnetic layer is free to rotate in the presence of an external magnetic field in the range of interest for the sensor. A basic magnetoresistive SV sensor is described in U.S. Pat. No. 5,206,590.

A magnetic tunnel junction (MTJ) device has two ferromagnetic layers separated by a nonmagnetic electrically insulating layer, called the tunnel barrier layer, which is typically formed of alumina. The magnetization direction of one of the ferromagnetic layers is pinned while the magnetization direction of the other ferromagnetic layer is free to rotate relative to the pinned layer. A tunneling current flows perpendicularly through the tunnel barrier layer depending upon the relative magnetization directions of the two ferromagnetic layers. Such MTJ devices are used as memory cells and as magnetoresistive sensors in magnetic heads. A basic MTJ sensor is described in U.S. Pat. No. 5,841,692.

The SV and MTJ devices have been improved by substitution of one or both of the free and pinned ferromagnetic layers with a laminated layer structure comprising two ferromagnetic films that are antiferromagnetically coupled to one another in an antiparallel orientation by an antiferromagnetically coupling (AFC) film. These improved devices are described in U.S. Pat. Nos. 6,153,320, 5,408,377 and 5,465,185. The sign and strength of the interlayer coupling for the thin AFC films is important for the performance of these laminated structures, and it depends in part upon the coupling film material. Ru as a coupling film material displays very strong antiferromagnetic coupling between cobalt (Co), cobalt-iron (CoFe) and nickel-iron (NiFe) ferromagnetic films even when just ~3 Å thick. This makes Ru very useful to form pairs of antiparallel oriented ferromagnetic films. It is also useful for many applications that the thickness of the AFC film be as thin as is practicable, because this takes up less space, and because the AFC film must not significantly increase the conductance of the laminated layer structure. Thus, Ru is particularly useful because it is very effective as a thin film coupling layer, and it has also been shown that the strength of its interlayer coupling decreases with increasing AFC film thickness. Finally, Ru is especially useful because it exhibits strong antiferromagnetic coupling for a wide range of ferromagnetic materials.

With particular regard to the present invention, it has been found that current SV designs and MTJ designs with an Ru AFC film can become thermally unstable after prolonged operation at elevated temperatures and/or high bias currents, and this instability manifests itself as a decrease in signal amplitude after prolonged operation under such conditions. In essence, these high temperature operating conditions, in excess of approximately 250° C., constitute an in-situ anneal of the laminated structure which can alter key operating parameters such as the antiferromagnetic coupling field between the anti-parallel ferromagnetic layers of the pinned layer structure. It is the object of the present invention to improve the stability of the sensor by employing materials less susceptible to the annealing effects attending such high temperature operating conditions, and to reduce the cost of fabrication of SV and MTJ devices by emphasizing materials less costly than Ru, Os, Ir and Rh, which have been used in the prior art due to their high AFC coupling coefficients. This is accomplished through alloying these materials with other materials of lower cost such as W, Ta, Mo, Nb and Re. For suitable compositional ranges, the cost of targets used to sputter these materials in the fabrication process can be significantly reduced without reducing the AFC coupling coefficient below a level where it would be too low to provide useful sensor characteristics.

SUMMARY OF THE INVENTION

The invention is a laminated ferromagnetic layer structure containing ferromagnetic films coupled together with improved AFC films that are comprised of alloy compositions of various metals. Particularly the AFC film comprises an alloy material selected from the group consisting of $Ru_{100-x}m_x$, $Os_{100-y}m_y$, $Ir_{100-y}m_y$, $Rh_{100-y}m_y$, $Re_{100-z}m_z$, and $M_{100-x}m_x$, where M is an alloy of two or more materials selected from the group consisting of Ru, Os, Ir, Rh, and Re, and where m is a material selected from the group consisting of W, Ta, Mo, Nb and alloys of two or more materials selected from W, Ta, Mo, and Nb, and where x is between approximately 5 and 95 at. %, y is between approximately 10 and 90 at. %, and z is between approximately 25 and 75 at. %.

Therefore, this invention obtains the benefits of either or both reduced cost of fabrication, and high thermal stability by suitably alloying AFC materials such as Ru, Os, Ir and Rh with materials such as W, Ta, Mo, Nb and Re, and consequently provides greater flexibility in the fabrication of such SV and MTJ sensors by allowing trade-offs between cost, thermal stability, and pinning field. The ferromagnetic film thicknesses, the AFC film thicknesses and the compositions of the films can be varied within the ranges given to obtain desired properties of the SV or MTJ sensor. The SV sensors may be used in GMR read head structures of magnetic heads of hard disk drives, and the MTJ sensors may be likewise used in GMR read heads and in memory cell applications.

It is an advantage of the laminated AFC magnetic sensor structure of the present invention that it includes an AFC film having a high thermal stability.

It is an advantage of the SV sensor of the present invention that it includes at least one laminated AFC ferromagnetic layer structure having a high thermal stability.

It is an advantage of the MTJ device of the present invention that it includes at least one laminated AFC ferromagnetic layer structure having a high thermal stability.

It is an advantage of the magnetic head of the present invention that it includes a sensor having at least one laminated ferromagnetic layer structure including two antiparallel coupled ferromagnetic films with an AFC film disposed therebetween, where the AFC film is comprised of alloy compositions of various metals. Particularly the AFC film comprises an alloy material selected from the group consisting of $Ru_{100-x}m_x$, $Os_{100-y}m_y$, $Ir_{100-y}m_y$, $Rh_{100-y}m_y$, $Re_{100-z}m_z$, and $M_{100-x}m_x$, where M is an alloy of two or more materials selected from the group consisting of Ru, Os, Ir, Rh, and Re, and where m is a material selected from the group consisting of W, Ta, Mo, Nb and alloys of two or more materials selected from W, Ta, Mo, and Nb, and where x is between approximately 5 and 95 at. %, y is between approximately 10 and 90 at. %, and z is between approximately 25 and 75 at. %.

It is another advantage of the magnetic head of the present invention that it includes a sensor having at least one laminated ferromagnetic layer structure including two antiparallel coupled ferromagnetic films with an AFC film disposed therebetween, where the AFC film is comprised of an alloy that exhibits low interdiffusion with materials from adjacent ferromagnetic films at high temperatures It is an advantage of the hard disk drive of the present invention that it includes a magnetic head of the present invention that includes a magnetoresistive sensor having a high thermal stability.

It is another advantage of the hard disk drive of the present invention that it includes a magnetic head of the present invention that includes a magnetoresistive sensor having at least one laminated ferromagnetic layer structure having a high thermal stability.

It is a further advantage of the hard disk drive of the present invention that it includes a magnetic head of the present invention that includes a magnetoresistive sensor having at least one laminated AFC ferromagnetic layer structure including two antiparallel coupled ferromagnetic films with an AFC film disposed therebetween, where the AFC film is comprised of alloy compositions of various metals. Particularly the AFC film comprises an alloy material selected from the group consisting of $Ru_{100-x}m_x$, $Os_{100-y}m_y$, $Ir_{100-y}m_y$, $Rh_{100-y}m_y$, $Re_{100-z}m_z$, and $M_{100-x}m_x$, where M is an alloy of two or more materials selected from the group consisting of Ru, Os, Ir, Rh, and Re, and where m is a material selected from the group consisting of W, Ta, Mo, Nb and alloys of two or more materials selected from W, Ta, Mo, and Nb, and where x is between approximately 5 and 95 at. %, y is between approximately 10 and 90 at. %, and z is between approximately 25 and 75 at. %.

It is yet another advantage of the hard disk drive of the present invention that it includes a magnetic head of the present invention that includes a magnetoresistive sensor having at least one laminated ferromagnetic layer structure including two antiparallel coupled ferromagnetic films with an AFC film disposed therebetween, where the AFC film is comprised of an alloy that exhibits low interdiffusion with materials from adjacent ferromagnetic films at high temperatures.

These and other features and advantages of the present invention will no doubt become apparent to those skilled in the art upon reading the following detailed description which makes reference to the several figures of the drawings.

IN THE DRAWINGS

Figure 2:
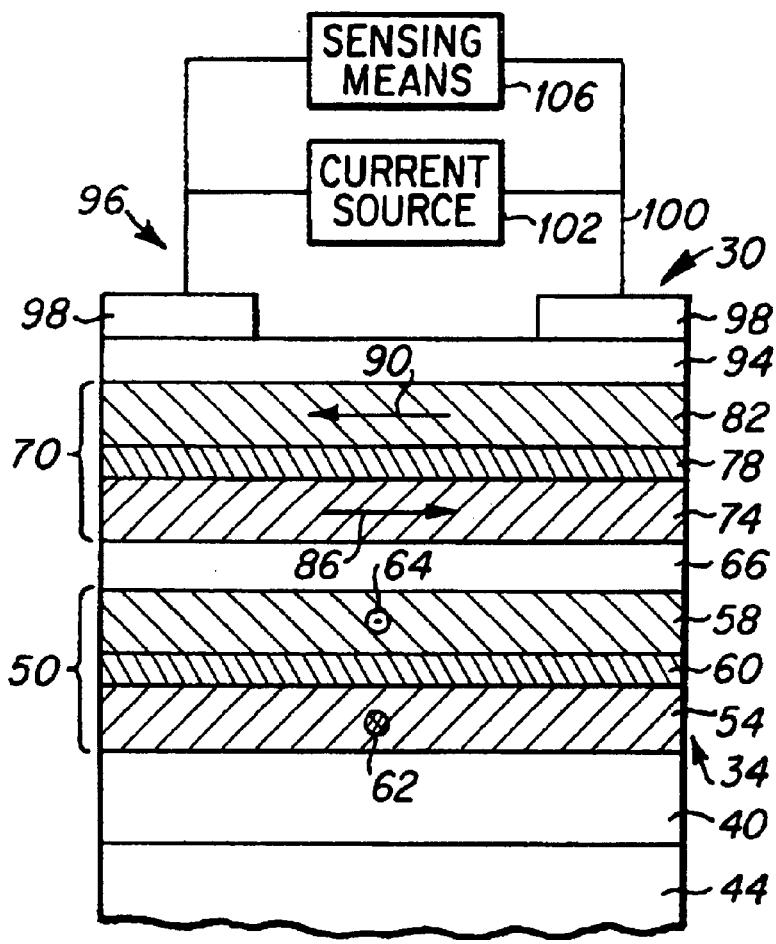
Figure 3:
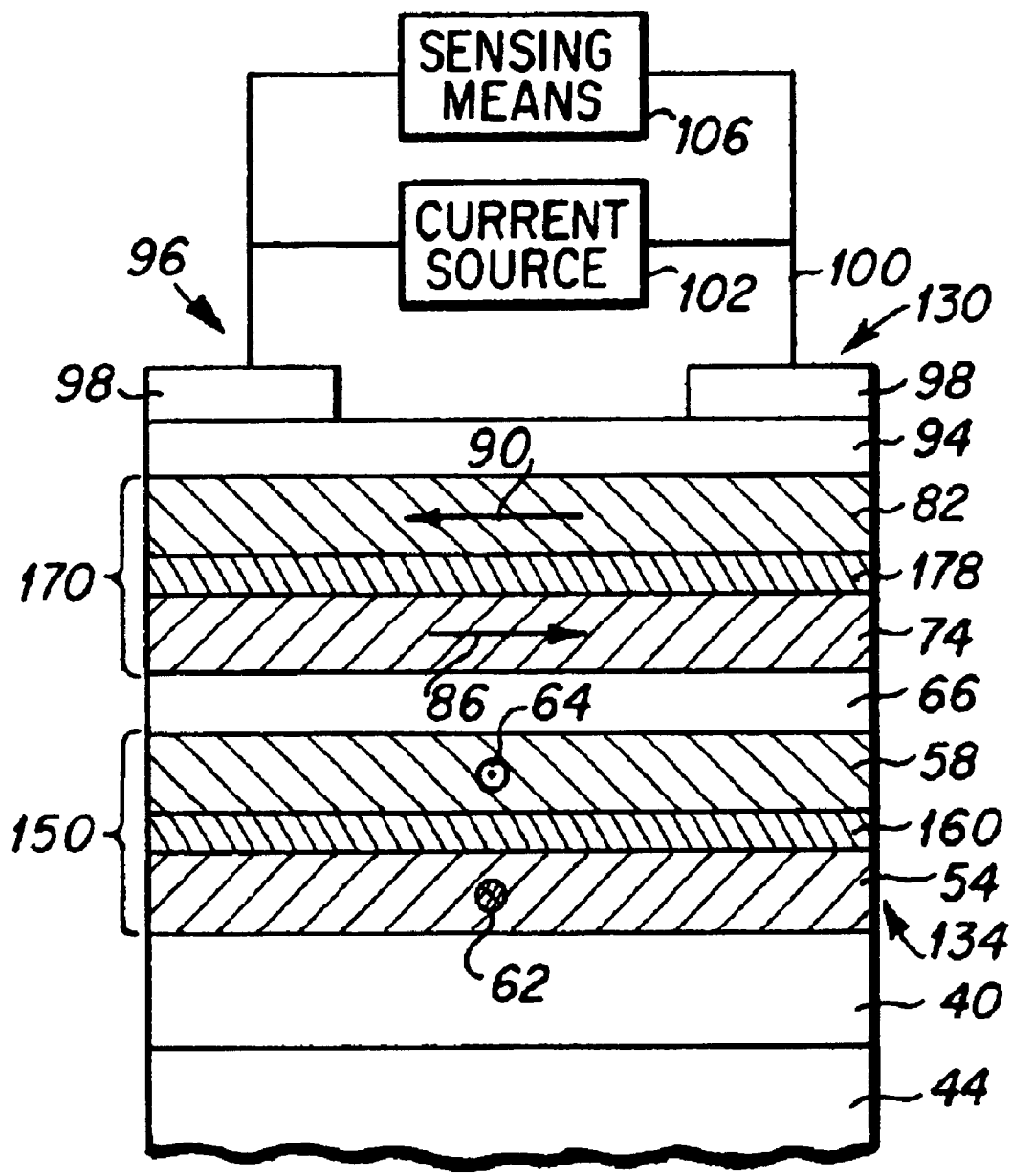

FIG. 1 is a top plan view generally depicting a hard disk drive including a magnetic head of the present invention;

FIG. 2 is a depiction of a prior art spin valve magnetoresistive sensor with laminated antiferromagnetically coupled free and pinned ferromagnetic layer structures; and FIG. 3 is a depiction of a spin valve magnetoresistive sensor of the present invention with laminated antiferromagnetically coupled free and pinned ferromagnetic layer structures including the AFC film material of the present invention.

Figure 4:
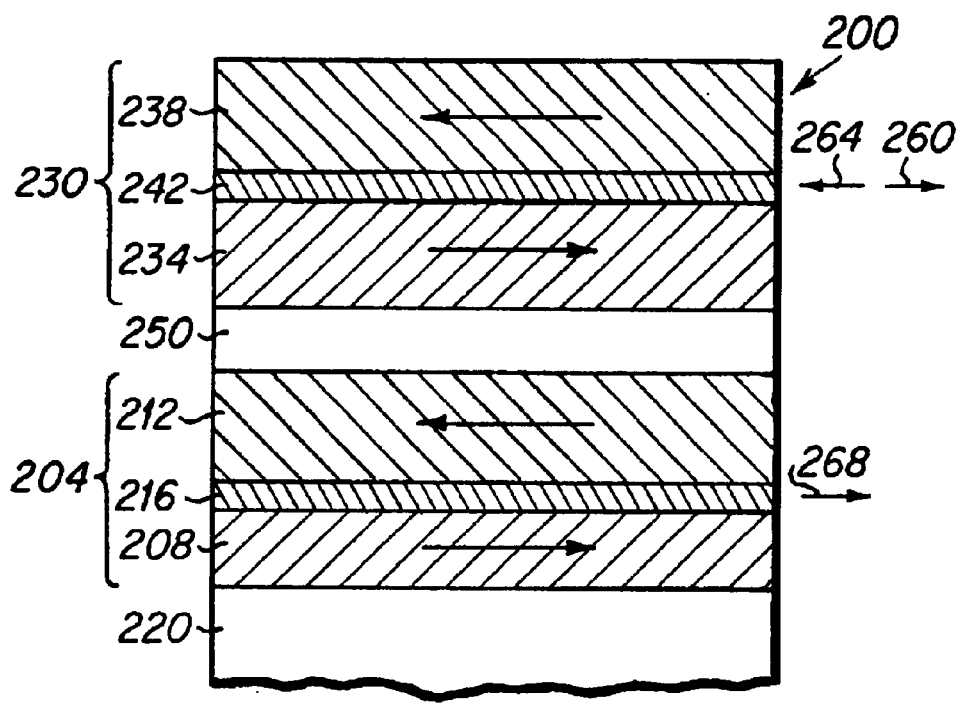
Figure 5:
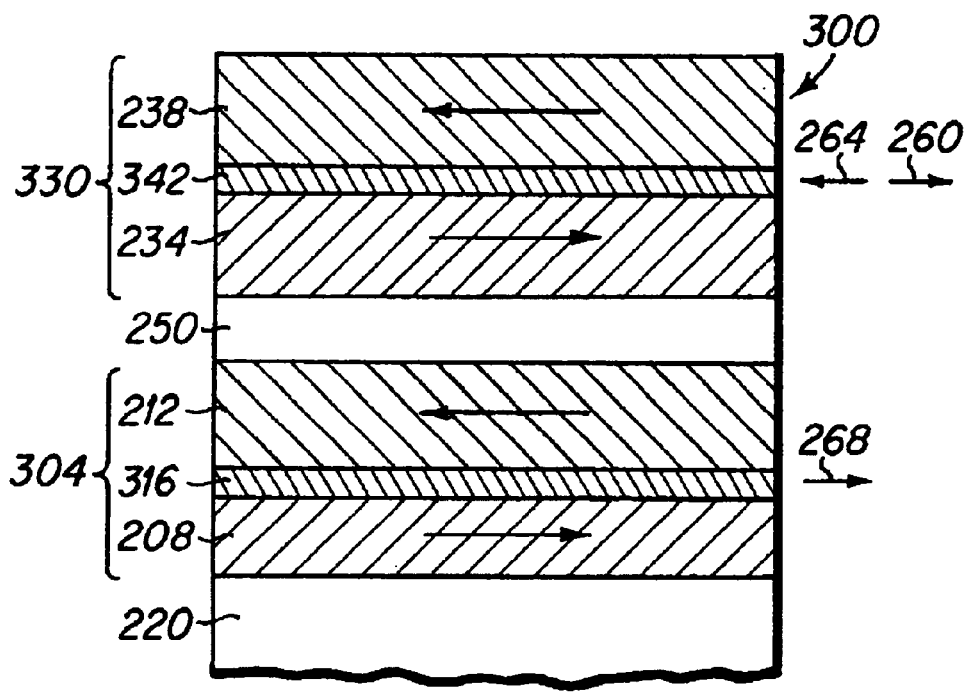

FIG. 4 is a depiction of a prior art magnetic tunnel junction (MTJ) device with laminated antiferromagnetically coupled free and pinned ferromagnetic layer structures; and FIG. 5 is a depiction of an MTJ device of the present invention with laminated antiferromagnetically coupled free and pinned ferromagnetic layer structures including the AFC film material of the present invention.

DETAILED DESCRIPTION OF THE PREFERRED EMBODIMENTS

FIG. 1 is a top plan view that depicts significant components of a hard disk drive which includes the magnetic head of the present invention. The hard disk drive 10 includes a magnetic media hard disk 12 that is rotatably mounted upon a motorized spindle 14. An actuator arm 16 is pivotally mounted within the hard disk drive 10 with a magnetic head 20 of the present invention disposed upon a distal end 22 of the actuator arm 16. A typical hard disk drive 10 may include a plurality of disks 12 that are rotatably mounted upon the spindle 14 and a plurality of actuator arms 16 each having at least one magnetic head 20 mounted upon the distal end 22 of each of the actuator arms. As is well known to those skilled in the art, when the hard disk drive 10 is operated, the hard disk 12 rotates upon the spindle 14 and the magnetic head 20 acts as an air bearing slider that is adapted for flying above the surface of the rotating disk. The slider includes a substrate base upon which the various layers and structures that form the magnetic head are fabricated. Such heads are fabricated in large quantities upon a wafer substrate and subsequently sliced into discrete magnetic heads 20.

FIG. 2 depicts a prior art read head portion of a prior art magnetic head 30 having a spin valve (SV) magnetoresistive sensor 34 with laminated antiferromagnetically coupled ferromagnetic films as both the free and pinned ferromagnetic layers. Basically, the sensor 34 has an antiferromagnetic layer 40 of approximately 100 Å to 500 Å thickness that is deposited on the substrate base 44. Suitable antiferromagnetic layer materials include PtMn, FeMn, IrMn, PdMn and NiMn. A laminated pinned ferromagnetic layer structure 50 is fabricated upon the antiferromagnetic layer 40, and it includes first and second ferromagnetic NiFe (permalloy) films 54 and 58 respectively, having generally equal thickness of approximately 30 Å that are separated by a thin Ru antiferromagnetic coupling (AFC) film 60 having a thickness of approximately 3 Å to 12 Å; in U.S. Pat. No. 6,153,320 an AFC film composed of RuOs is described, and as used herein, an Ru AFC film will mean both Ru and RuOs composed films. The ferromagnetic films 54 and 58 have their magnetic moments aligned antiparallel, as shown by arrow 62 into the paper and arrow 64 out of the paper respectively. A Cu spacer layer 66 is deposited onto the pinned ferromagnetic layer structure 50 to serve as a non-ferromagnetic metallic spacer layer for the SV sensor 34. While Cu is preferred, other nonferromagnetic metallic materials with high electrical conductivity, such as silver (Ag), gold (Au), and their alloys, can be used.

A free ferromagnetic layer structure 70 is next fabricated on top of the spacer layer 66. The free magnetic layer structure 70 is also a laminated structure that includes a first NiFe film 74 having a thickness of approximately 30 Å that is fabricated on the Cu spacer layer 66, a Ru AFC film 78 of approximately 3 Å to 12 Å thickness that is deposited onto the first ferromagnetic film 74, and a second NiFe ferromagnetic film 82 of approximately 30 Å thickness that is formed on the Ru AFC film 78. The two free ferromagnetic films 74 and 82 are deposited in the presence of applied magnetic fields rotated approximately 90 degrees from the fields applied during the deposition of the pinned ferromagnetic layer structure 50. Thus, the first free ferromagnetic film 74 is formed with a magnetic moment shown by arrow 86, and the second free ferromagnetic film 82 is formed with an antiparallel magnetic moment shown by arrow 90. Finally, a capping layer 94 having a thickness of approximately 25 Å is formed over the free ferromagnetic layer structure 70, and suitable capping materials are high resistivity materials, such as Ta or Zr or various oxides thereof.

The antiparallel alignment of the magnetic moments of the two pinned ferromagnetic films 54 and 58, indicated by arrows 62 and 64, respectively, is due to the antiferromagnetic coupling through the AFC film 60. Because of this antiferromagnetic coupling, and because the two films 54 and 58 have substantially the same thickness, the magnetic moments of each of the films 54 and 58 cancel each other so that there is essentially no net magnetic moment in the laminated pinned ferromagnetic layer structure 50. Thus, there is essentially a nonmagnetic dipole field generated by the pinned ferromagnetic layer structure 50, and thus no net magnetic field to affect the direction of the net magnetic moment of the laminated free ferromagnetic layer structure 70.

FIG. 2 also illustrates schematically the means for connecting the sensor 34 to sensing circuitry 96 in the magnetic head 30 and hard disk drive device 10. Electrical leads 98 are provided to form a circuit path 100 between the sensor 34 and a current source 102 and a sensing means 106. As is well known in the art, additional sensor elements, such as traverse and longitudinal bias layers (not shown), may be required to provide an optimal sensor response circuit. In the preferred embodiment, a magnetic signal in the disk medium 12 is sensed by the sensing means 106 detecting the change in resistance of the sensor 34 as the magnetization direction of the laminated free ferromagnetic layer structure 70 rotates relative to the fixed magnetization direction of the laminated pinned ferromagnetic layer structure 50 in response to the applied magnetic signal from the recorded medium 12.

A general example of the prior art SV design described above employs an NiFe/Ru/NiFe anti-parallel (AP) ferromagnetic layer structure 50 and/or 70 that depends on the thickness of the Ru AFC film 60 and/or 78 respectively in order to maintain the antiferromagnetic coupling field between the adjacent NiFe films at the proper level for good sensor stability. However, under operating conditions of high temperature and/or high bias current, the temperature of the sensor 34 can become sufficiently high (above approximately 250° C.) that interfacial interdiffusion of Ru with NiFe occurs at the interfaces in the thin film structures 50 and/or 70. As a result, the effective thickness of the Ru AFC film is less than that of the deposited AFC film, and becomes that of the remaining uncontaminated Ru; that is, the original AFC film thickness less any interdiffused alloy film layers created at the interfaces within the NiFe/Ru/NiFe structure. The exchange coupling between the two NiFe layers responsible for the AFC field pinning in the pinned ferromagnetic layer structure 50 depends critically on the thickness of the AFC film 60. Experimental data indicates that changes of only 1 Å to 2 Å from the nominal 8 Å thickness of this film can significantly degrade the magnetic rigidity with which the pinned layer is held in place by a degraded AFC field, and for thinner Ru AFC films the undesirable effect is even more pronounced.

As depicted in FIG. 3, the present invention involves replacing the Ru AFC film material with other more interdiffusion-resistant, less expensive materials. It is known from diffusion theory that the diffusivity of metals generally scales with the melting point of the metal. Therefore, on this basis, a corresponding proportionate increase in the temperature at which the onset of interdiffusion and attending thermal instability of the SV sensor occurs for an AFC layer structure based on NiFe/X/NiFe where X has a higher melting point than Ru. A preferred embodiment of the SV sensor 134 of the present invention as depicted in FIG. 3, and which can be incorporated within the magnetic head 20, thus includes the substitution of a high melting point metal alloy in the AFC film layers 160 and/or 178 for the prior art Ru AFC layer 60 and/or 78 respectively to improve the thermal stability of the AP pinned SV structure 150, and/or the AP free SV structure 170. While, the strength of the exchange field using another material in place of Ru may be somewhat reduced, and the corresponding AFC film thickness for antiferromagnetic coupling with another material may be different from what it is for Ru, in the range of approximately 3 Å to 30 Å, the melting point of a suitable material will be significantly higher than that of Ru. Another advantage of such suitable materials is that they are considerably less expensive than Ru.

A preferred embodiment of a magnetic head of the present invention includes an AP pinned layer SV structure 150 such as NiFe/X/NiFe, NiCo/X/NiFe, CoFe/X/NiFe, NiFe/X/NiCo, NiFe/X/CoFe or CoFe/X/CoFe, in contact with and on top of an antiferromagnetic layer 40, such as a PtMn layer, wherein X is a metal selected from the group consisting of alloy compositions of various metals. Particularly the AFC film comprises an alloy material X selected from the group consisting of $Ru_{100-x}m_x$, $Os_{100-y}m_y$, $Ir_{100-y}m_y$, $Rh_{100-y}m_y$, $Re_{100-z}m_z$, and $M_{100-x}m_x$, where M is an alloy of two or more materials selected from the group consisting of Ru, Os, Ir, Rh, and Re, and where m is a material selected from the group consisting of W, Ta, Mo, Nb and alloys of two or more materials selected from W, Ta, Mo, and Nb, and where x is between approximately 5 and 95 at. %, y is between approximately 10 and 90 at. %, and z is between approximately 25 and 75 at. %. In this regard, fabricating a read head by changing the prior art AFC material film to a material X film may generally be accomplished by changing the target in the deposition tool from an Ru target to an X target for the subsequent fabrication of the coupling film layer.

The magnetic head of the present invention may also include a non-magnetic, electrically conductive spacer layer 66, preferably Cu, in contact with and on top of the pinned SV structure 150. A free ferromagnetic layer SV structure 170 may be fabricated on top of the spacer layer 66, and may include an NiFe/X/NiFe, NiCo/X/NiFe, CoFe/X/NiFe, NiFe/X/NiCo, NiFe/X/CoFe or CoFe/X/CoFe AFC structure wherein X is a metal or alloy described above that is incorporated within the laminated free ferromagnetic layer 170 discussed above.

A prior art MTJ device 200 is shown in FIG. 4, in which a laminated fixed ferromagnetic layer structure 204 is comprised of a sandwich of two ferromagnetic films 208 and 212 separated by a nonferromagnetic Ru AFC film 216 which couples the ferromagnetic films 208 and 212 antiferromagnetically such that the magnetic moments of films 208 and 212 are arranged antiparallel to one another. The lower ferromagnetic film 208 is deposited on an antiferromagnetic exchange layer 220, which provides exchange biasing for film 208 so that the moment of film 208 is prevented from rotation in the presence of a magnetic field in the range of interest. Because film 212 is antiferromagnetically coupled to film 208 it too is prevented from rotation. Similarly a free ferromagnetic layer structure 230 of the MTJ sensor 200 is comprised of two ferromagnetic films 234 and 238 separated by a thin nonferromagnetic AFC film 242 which couples the moments of films 234 and 238 antiferromagnetically.

In the MTJ device 200, the laminated fixed 204 and free 230 ferromagnetic layer structures are separated by a non-magnetic spacer 250, which is an electrically insulating tunnel barrier layer, typically formed of alumina. When the MTJ device 200 is used in a magnetic head, the magnetic moments of the ferromagnetic films making up the fixed 204 and free 230 ferromagnetic layer structure have the orientations as shown in FIG. 2 for the spin valve GMR head. However, when the MTJ device is used as a magnetic memory cell, the magnetic moments of the laminated ferromagnetic layer structures 204 and 230 are aligned anti-parallel with one another, as shown in FIG. 4. In the case of the memory cell, the moments of the free ferromagnetic films 234 and 238 will rotate together as a rigid unit so that the net moment of free ferromagnetic layer structure 230 will be either parallel (arrow 260) or antiparallel (arrow 264) to the net moment (arrow 268) of the fixed ferromagnetic layer structure 204.

A general example of the prior art MTJ device 200 described above employs an NiFe/Ru/NiFe anti-parallel (AP) ferromagnetic layer structure 204 and/or 230 that depends on the thickness of the Ru AFC film 216 and/or 242 respectively in order to maintain the antiferromagnetic coupling field between the adjacent NiFe films at the proper level for good stability. However, under operating conditions of high temperature and/or high bias current, the temperature of the device 200 can become sufficiently high (above approximately 250° C.) that interfacial interdiffusion of Ru with NiFe occurs at the interfaces in the thin film structures 204 and/or 230. As a result, the effective thickness of the Ru AFC film is less than that of the deposited AFC film, and becomes that of the remaining uncontaminated Ru; that is, the original AFC film thickness less any interdiffused alloy film layers created at the interfaces within the NiFe/Ru/NiFe structure. The exchange coupling between the two NiFe layers responsible for the AFC field pinning in the pinned ferromagnetic layer structure 204 depends critically on the thickness of the AFC film 216. Experimental data indicates that changes of only 1 Å to 2 Å from the nominal 8 Å thickness of this film can significantly degrade the magnetic rigidity with which the pinned layer is held in place by a degraded AFC field, and for thinner Ru AFC films the undesirable effect is even more pronounced.

As depicted in FIG. 5, an MTJ device 300 of the present invention, which may be incorporated into the magnetic head 20, involves replacing the prior art Ru AFC film material 216 and/or 242 with other more interdiffusion-resistant, less expensive materials. Basically, the MTJ device 300 includes an AP pinned layer MTJ structure 304 such as NiFe/X/NiFe, NiCo/X/NiFe, CoFe/X/NiFe, NiFe/X/NiCo, NiFe/X/CoFe or CoFe/X/CoFe, in contact with and on top of an antiferromagnetic layer 220, such as a PtMn layer, wherein X is a metal selected from the group consisting of alloy compositions of various metals. The pinned layer MTJ structure 304 thus includes two ferromagnetic films 208 and 212, which may be the same as in the prior art device of FIG. 4, that are separated by a nonferromagnetic AFC film 316. Particularly the AFC film 316 comprises an alloy material X selected from the group consisting of $Ru_{100-x}m_x$, $Os_{100-y}m_y$, $Ir_{100-y}m_y$, $Rh_{100-y}m_y$, $Re_{100-z}m_z$, and $M_{100-x}m_x$, where M is an alloy of two or more materials selected from the group consisting of Ru, Os, Ir, Rh, and Re, and where m is a material selected from the group consisting of W, Ta, Mo, Nb and alloys of two or more materials selected from W, Ta, Mo, and Nb, and where x is between approximately 5 and 95 at. %, y is between approximately 10 and 90 at. %, and z is between approximately 25 and 75 at. %. In this regard, fabricating a read head by changing the prior art AFC material film to a material X film may generally be accomplished by changing the target in the deposition tool from an Ru target to an X target for the subsequent fabrication of the AFC film layer.

The MTJ device 300 also includes a non-magnetic, electrically non-conductive spacer layer 250, preferably alumina, in contact with and on top of the pinned MTJ structure 304. A free ferromagnetic layer MTJ structure 330 is fabricated on top of the spacer layer 250, and may include the incorporation of an NiFe/X/NiFe, NiCo/X/NiFe, CoFe/X/NiFe, NiFe/X/NiCo, NiFe/X/CoFe or CoFe/X/CoFe AFC structure wherein X is a metal or alloy described above that is incorporated within the laminated free ferromagnetic layer structure 330. Particularly, the free layer MTJ structure 330 includes two ferromagnetic films 234 and 238, which may be the same as in the prior art device of FIG. 4, that are separated by a nonferromagnetic AFC film 342 comprised of the metal alloy material X.

It is known from diffusion theory that the diffusivity of metals generally scales with the melting point of the metal. Therefore, on this basis, a corresponding proportionate increase in the temperature at which the onset of interdiffusion and attending thermal instability of an MTJ device occurs for an AFC layer structure based on NiFe/X/NiFe where X has a higher melting point than Ru. The preferred embodiment of the MTJ device 300 as depicted in FIG. 5 thus includes the substitution of a high melting point metal alloy in the AFC film layers 316 and/or 342 for the prior art Ru AFC layer 216 and/or 242 respectively to improve the thermal stability of the AP pinned MTJ structure 304, and/or the AP free MTJ structure 330. While, the strength of the exchange field using another material in place of Ru may be somewhat reduced, and the corresponding AFC film thickness for antiferromagnetic coupling with another material may be different from what it is for Ru, in the range of approximately 3 Å to 30 Å, the melting point of a suitable material will be significantly higher than that of Ru. Another advantage of such suitable materials is that they are considerably less expensive than Ru.

Generally, a suitable material for an AFC film will have the same crystal structure, hexagonal close packed (HCP), and similar lattice parameters that can facilitate their interchangeability as AFC films in the SV or MTJ structure. High-melting-point metals such as Ta or W can be used in place of Ru, but pose a problem from the point of view of crystallographic structure because Ta and W are body centered cubic (bcc) structures, and also from the point of view of substantially weaker exchange coupling.

As discussed above, the present invention addresses the problem of the thermal instability of the AP pinned laminated structure and/or AP free laminated structure. A simple solution to this problem could be to thicken the Ru AFC films 60 and/or 78 so that after annealing and interdiffusion there is sufficient Ru left to assure a good antiferromagnetic coupling field. While this solution is probably the least invasive to the fabrication process, it will generally not result in a quantum increase in thermal stability, and the thicker Ru layer may weaken the AFC field strength. The advantage of the present invention is that a large increase in thermal stability is achieved by changing the AFC film to a material having a significantly higher melting point than Ru. Another advantage of the invention is that the quantum improvement in thermal stability can lead to an improvement in sensor signal amplitude by running the sensor at higher bias currents. Additionally, significant cost reductions are achieved by using less expensive alloy materials.

While the present invention has been particularly shown and described with reference to the preferred embodiments, it will be understood by those skilled in the art that various changes in form and detail may be made without departing from the spirit and scope of the invention. Particularly, FIGS. 3 and 5 show a magnetic devices where both the free and pinned ferromagnetic layers can be made with the laminated structures 170, 150 and 330, 304 respectively, having the novel AFC metal films X according to the present invention. It is thus within the scope of the present invention that either one or the other or both of the free and pinned ferromagnetic layers can be a laminated structure according to the present invention. Accordingly, the disclosed invention is to be considered merely as illustrative and limited in scope only as specified in the appended claims.

What is claimed is:

1. A magnetic head including a magnetoresistive sensor comprising:
   a pinned ferromagnetic layer structure;
   a free ferromagnetic layer structure; and
   a nonmagnetic spacer layer located between the pinned and free ferromagnetic layers structures; and wherein at least one of the pinned and free ferromagnetic layers structure includes:
   first and second ferromagnetic films;
   an antiferromagnetic coupling (AFC) film located between and in contact with said first and second ferromagnetic films, said AFC film comprising an alloy material selected from the group consisting of $Ru_{100-x}m_x$, $Os_{100-y}m_y$, $Ir_{100-y}m_y$, $Rh_{100-y}m_y$, $Re_{100-z}m_z$, and $M_{100-x}m_x$, where M is an alloy of two or more materials selected from the group consisting of Ru, Os, Ir, Rh, and Re, and where m is a material selected from the group consisting of W, Ta, Mo, Nb and alloys of two or more materials selected from W, Ta, Mo, and Nb, and where x is between approximately 5 and 95 at. %, y is between approximately 10 and 90 at. %, and z is between approximately 25 and 75 at. %.

2. A magnetic head as described in claim 1 wherein said AFC film has a thickness from approximately 3 Å to approximately 30 Å.

3. A magnetic head as described in claim 1 wherein said pinned ferromagnetic layer structure includes NiFe/X/NiFe, NiCo/X/NiFe, CoFe/X/NiFe, NiFe/X/NiCo, NiFe/X/CoFe or CoFe/X/CoFe, where X consists of said AFC film.

4. A magnetic head as described in claim 1 wherein said free ferromagnetic layer structure includes NiFe/X/NiFe, NiCo/X/NiFe, CoFe/X/NiFe, NiFe/X/NiCo, NiFe/X/CoFe or CoFe/X/CoFe, where X consists of said AFC film.

5. A magnetic head as described in claim 1 wherein both said pinned ferromagnetic layer structure and said free ferromagnetic layer structure include first and second ferromagnetic films having said AFC film formed therebetween.

6. A hard disk drive including a magnetic head magnetic head including a magnetoresistive sensor comprising:
   a pinned ferromagnetic layer structure;
   a free ferromagnetic layer structure; and
   a nonmagnetic spacer layer located between the pinned and free ferromagnetic layers structures; and wherein at least one of the pinned and free ferromagnetic layers structure includes:
   first and second ferromagnetic films;
   an antiferromagnetic coupling (AFC) film located between and in contact with said first and second ferromagnetic films, said AFC film having a thickness sufficient to couple said first and second ferromagnetic films together with their magnetic moments oriented antiparallel to one another; said AFC film comprising an alloy material selected from the group consisting of $Ru_{100-x}m_x$, $Os_{100-y}m_y$, $Ir_{100-y}m_y$, $Rh_{100-y}m_y$, $Re_{100-z}m_z$, and $M_{100-x}m_x$, where M is an alloy of two or more materials selected from the group consisting of Ru, Os, Ir, Rh, and Re, and where m is a material selected from the group consisting of W, Ta, Mo, Nb and alloys of two or more materials selected from W, Ta, Mo, and Nb, and where x is between approximately 5 and 95 at. %, y is between approximately 10 and 90 at. %, and z is between approximately 25 and 75 at. %.

7. A hard disk drive including a magnetic head magnetic head as described in claim 6 wherein said AFC film has a thickness from approximately 3 Å to approximately 30 Å.

8. A hard disk drive including a magnetic head magnetic head as described in claim 6 wherein said pinned ferromagnetic layer structure includes NiFe/X/NiFe, NiCo/X/NiFe, CoFe/X/NiFe, NiFe/X/NiCo, NiFe/X/CoFe or CoFe/X/CoFe, where X consists of said AFC film.

9. A hard disk drive including a magnetic head magnetic head as described in claim 6 wherein said free ferromagnetic layer structure includes NiFe/X/NiFe, NiCo/X/NiFe, CoFe/X/NiFe, NiFe/X/NiCo, NiFe/X/CoFe or CoFe/X/CoFe, where X consists of said AFC film.

10. A hard disk drive including a magnetic head magnetic head as described in claim 6 wherein both said pinned ferromagnetic layer structure and said free ferromagnetic layer structure include first and second ferromagnetic films having said AFC film formed therebetween.

11. A laminated ferromagnetic layer structure, comprising:
    first and second ferromagnetic films;
    an antiferromagnetic coupling (AFC) film located between and in contact with said first and second ferromagnetic films, said AFC film comprising an alloy material selected from the group consisting of $Ru_{100-x}n_x$, where n is a material selected from the group consisting of W, Mo, Nb and alloys of two or more materials selected from the group consisting of W, Ta, Mo and Nb, and $Os_{100-y}m_y$, $Ir_{100-y}m_y$, $Rh_{100-y}m_y$, $Re_{100-z}m_z$, and $M_{100-x}m_x$, where M is an alloy of two or more materials selected from the group consisting of Ru, Os, Ir, Rh, and Re, and where m is a material selected from the group consisting of W, Ta, Mo, Nb and alloys of two or more materials selected from W, Ta, Mo, and Nb, and where x is between approximately 5 and 95 at. %, y is between approximately 10 and 90 at. %, and z is between approximately 25 and 75 at. %.

12. A laminated ferromagnetic layer structure as described in claim 11 wherein said AFC film has a thickness from approximately 3 Å to approximately 30 Å.

13. A laminated ferromagnetic layer structure as described in claim 11 wherein said ferromagnetic layer structure includes NiFe/X/NiFe, NiCo/X/NiFe, CoFe/X/NiFe, NiFe/X/NiCo, NiFe/X/CoFe or CoFe/X/CoFe, where X consists of said AFC film.

14. A spin valve sensor structure, comprising:
a pinned ferromagnetic layer structure;
a free ferromagnetic layer structure; and
a nonmagnetic, electrically conductive spacer layer located between the pinned and free ferromagnetic layers structures; and wherein at least one of the pinned and free ferromagnetic layers structure includes:
first and second ferromagnetic films;
an antiferromagnetic coupling (AFC) film located between and in contact with said first and second ferromagnetic films, said AFC film comprising an alloy material selected from the group consisting of $Ru_{100-x}m_x$, $Os_{100-y}m_y$, $Ir_{100-y}m_y$, $Rh_{100-y}m_y$, $Re_{100-z}m_z$, and $M_{100-x}m_x$, where M is an alloy of two or more materials selected from the group consisting of Ru, Os, Ir, Rh, and Re, and where m is a material selected from the group consisting of W, Ta, Mo, Nb and alloys of two or more materials selected from W, Ta, Mo, and Nb, and where x is between approximately 5 and 95 at. %, y is between approximately 10 and 90 at. %, and z is between approximately 25 and 75 at. %.

15. A spin valve sensor structure as described in claim 14 wherein said AFC film has a thickness from approximately 3 Å to approximately 30 Å.

16. A spin valve sensor structure as described in claim 14 wherein said pinned ferromagnetic layer structure includes NiFe/X/NiFe, NiCo/X/NiFe, CoFe/X/NiFe, NiFe/X/NiCo, NiFe/X/CoFe or CoFe/X/CoFe, where X consists of said AFC film.

17. A spin valve sensor structure as described in claim 14 wherein said free ferromagnetic layer structure includes NiFe/X/NiFe, NiCo/X/NiFe, CoFe/X/NiFe, NiFe/X/NiCo, NiFe/X/CoFe or CoFe/X/CoFe, where X consists of said AFC film.

18. A spin valve sensor structure as described in claim 14 wherein both said pinned ferromagnetic layer structure and said free ferromagnetic layer structure include first and second ferromagnetic films having said AFC film formed therebetween.

19. A magnetic tunnel junction structure, comprising:
a pinned ferromagnetic layer structure;
a free ferromagnetic layer structure; and
a nonmagnetic, electrically insulative spacer layer located between the pinned and free ferromagnetic layers structures; and wherein at least one of the pinned and free ferromagnetic layers structure includes:
first and second ferromagnetic films;
an antiferromagnetic coupling (AFC) film located between and in contact with said first and second ferromagnetic films, said AFC film comprising an alloy material selected from the group consisting of $Ru_{100-x}m_x$, $Os_{100-y}m_y$, $Ir_{100-y}m_y$, $Rh_{100-y}m_y$, $Re_{100-z}m_z$, and $M_{100-x}m_x$, where M is an alloy of two or more materials selected from the group consisting of Ru, Os, Ir, Rh, and Re, and where m is a material selected from the group consisting of W, Ta, Mo, Nb and alloys of two or more materials selected from W, Ta, Mo, and Nb, and where x is between approximately 5 and 95 at. %, y is between approximately 10 and 90 at. %, and z is between approximately 25 and 75 at. %.

20. A magnetic tunnel junction structure as described in claim 19 wherein said AFC film has a thickness from approximately 3 Å to approximately 30 Å.

21. A magnetic tunnel junction structure as described in claim 19 wherein said pinned ferromagnetic layer structure includes NiFe/X/NiFe, NiCo/X/NiFe, CoFe/X/NiFe, NiFe/X/NiCo, NiFe/X/CoFe or CoFe/X/CoFe, where X consists of said AFC film.

22. A magnetic tunnel junction structure as described in claim 19 wherein said free ferromagnetic layer structure includes NiFe/X/NiFe, NiCo/X/NiFe, CoFe/X/NiFe, NiFe/X/NiCo, NiFe/X/CoFe or CoFe/X/CoFe, where X consists of said AFC film.

23. A magnetic tunnel junction structure as described in claim 19 wherein both said pinned ferromagnetic layer structure and said free ferromagnetic layer structure include first and second ferromagnetic films having said AFC film formed therebetween.

* * * * *